United States Patent
Manipatruni et al.

(10) Patent No.: US 11,114,144 B2
(45) Date of Patent: Sep. 7, 2021

(54) MAGNETOELECTRIC SPIN ORBIT LOGIC WITH PARAMAGNETS

(71) Applicant: Intel Corporation, Santa Clara, CA (US)

(72) Inventors: Sasikanth Manipatruni, Portland, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 127 days.

(21) Appl. No.: 16/464,260

(22) PCT Filed: Dec. 23, 2016

(86) PCT No.: PCT/US2016/068594
§ 371 (c)(1),
(2) Date: May 24, 2019

(87) PCT Pub. No.: WO2018/118094
PCT Pub. Date: Jun. 28, 2018

(65) Prior Publication Data
US 2019/0325932 A1    Oct. 24, 2019

(51) Int. Cl.
*G11C 11/16*    (2006.01)
*H01L 43/04*    (2006.01)
(Continued)

(52) U.S. Cl.
CPC .......... *G11C 11/161* (2013.01); *H01L 27/228* (2013.01); *H01L 43/04* (2013.01);
(Continued)

(58) Field of Classification Search
CPC ....... H01L 43/08; H01L 43/06; H01L 27/228; H01L 43/04; H01L 43/065; H01L 43/10;
(Continued)

(56) References Cited

U.S. PATENT DOCUMENTS

| 2005/0036399 A1 | 2/2005 | Park et al. |
| 2007/0206407 A1 | 9/2007 | Johnson |

(Continued)

FOREIGN PATENT DOCUMENTS

WO    2016105436    6/2016

OTHER PUBLICATIONS

"Sasikanth Manipatruni, Dmitri E. Nikonov, Ian A. Young, Spin-Orbit Logic with Magnetoelectric Nodes: A Scalable Charge Mediated Nonvolatile Spintronic Logic, Dec. 17, 2015, arXiv:1512.05428v1, p. 1-22" (Year: 2015).*

(Continued)

*Primary Examiner* — Nelson Garces
(74) *Attorney, Agent, or Firm* — Green, Howard & Mughal LLP

(57) ABSTRACT

An apparatus is provided which comprises: a first paramagnet; a stack of layers, a portion of which is adjacent to the first paramagnet, wherein the stack of layers is to provide an inverse Rashba-Edelstein effect; a second paramagnet; a magnetoelectric layer adjacent to the second paramagnet; and a conductor coupled to at least a portion of the stack of layers and the magnetoelectric layer.

23 Claims, 11 Drawing Sheets

(51) Int. Cl.
- H01L 43/06 (2006.01)
- H01L 27/22 (2006.01)
- H01L 43/10 (2006.01)
- H01L 43/14 (2006.01)

(52) U.S. Cl.
CPC ............ *H01L 43/065* (2013.01); *H01L 43/10* (2013.01); *H01L 43/14* (2013.01)

(58) Field of Classification Search
CPC ... H01L 43/14; H01L 27/224; H01F 10/3286; G11C 11/161
See application file for complete search history.

(56) References Cited

U.S. PATENT DOCUMENTS

| | | | |
|---|---|---|---|
| 2011/0001473 A1 | 1/2011 | Moriyama et al. | |
| 2012/0176154 A1* | 7/2012 | Behin-Aein | H03K 19/20 326/37 |
| 2015/0228889 A1* | 8/2015 | Yamane | H01L 43/10 257/421 |
| 2015/0269478 A1* | 9/2015 | Datta | G11C 11/18 706/33 |
| 2015/0270481 A1* | 9/2015 | Annunziata | H01L 43/02 257/421 |
| 2016/0191281 A1* | 6/2016 | Oh | H04L 5/0005 375/300 |

OTHER PUBLICATIONS

International Search Report and Written Opinion from PCT Application No. PCT/US2016/068594 dated Sep. 22, 2017, 16 pgs.

Liu, L. Q. et al., "Spin-Torque Ferromagnetic Resonance Induced by the Spin Hall Effect", Phys. Rev. Lett. 106, 036601 (2011). 4 pages.

Liu, L. Q. "Spin-Torque Switching with the Giant Spin Hall Effect of Tantalum", Science 336, 555 (2012); DOI: 10.1126/science.1218197. 5 pages.

Liu, M. et al., "Voltage control of magnetism in multiferroic heterostructures", Phil.Trans.R.Soc.A372: 120439. http://dx.doi.org/10.1098/rsta.2012.0439. 15 pages.

Pai et al., "Spin transfer torque devices utilizing the giant spin HALL effect of tungsten", Appl. Phys. Lett. 101, 122404 (2012; doi: 10.1063/1.4753947, 5 pgs.

Sanchez et al., "Spin-to-charge conversion using Rashba coupling at the interface between non-magnetic materials", Nature Communications, published on Dec. 7, 2013; 7 pages. www.nature.com/naturecommunications; DOI: 10.1038/ncomms3944.

* cited by examiner

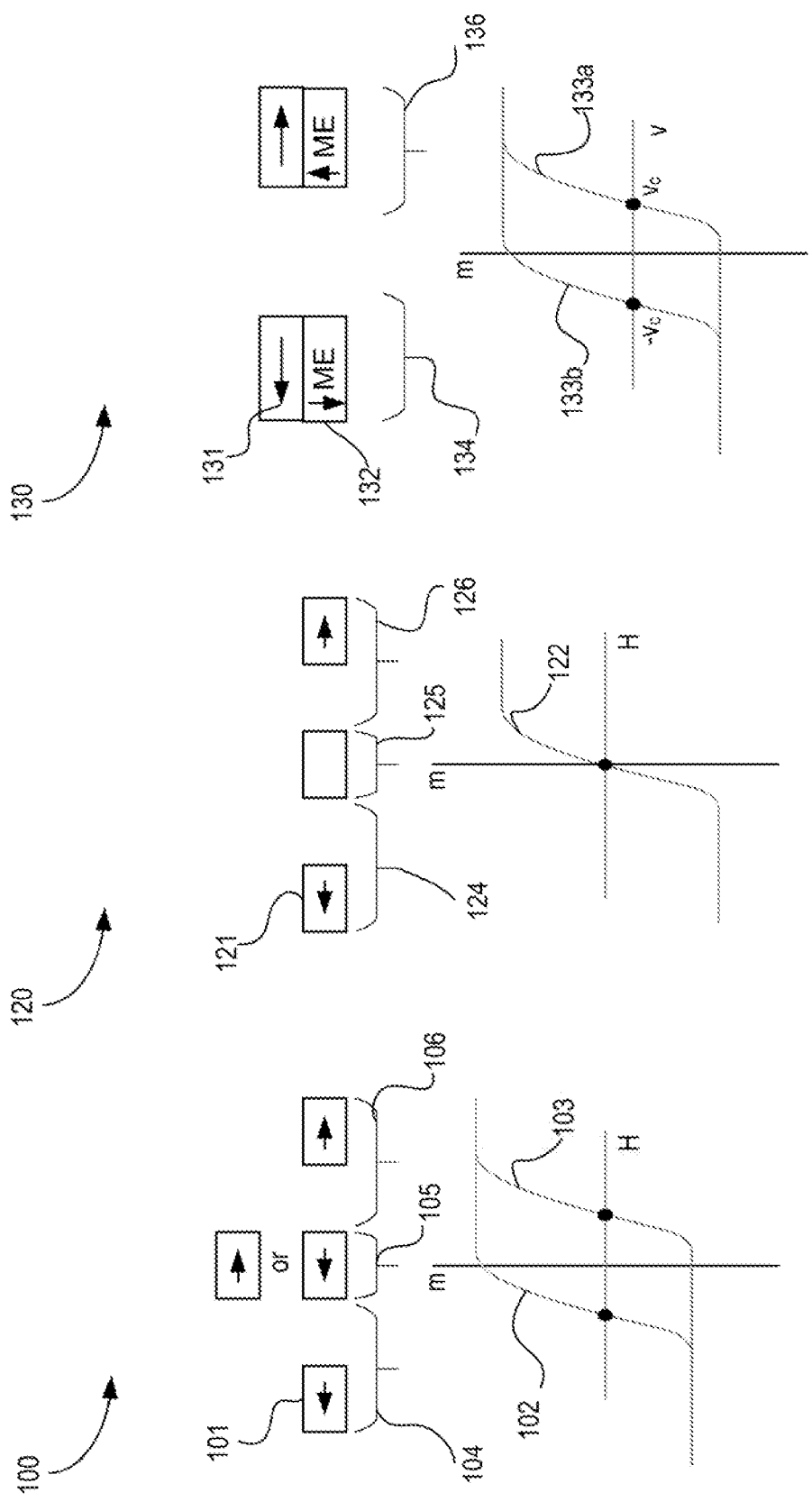

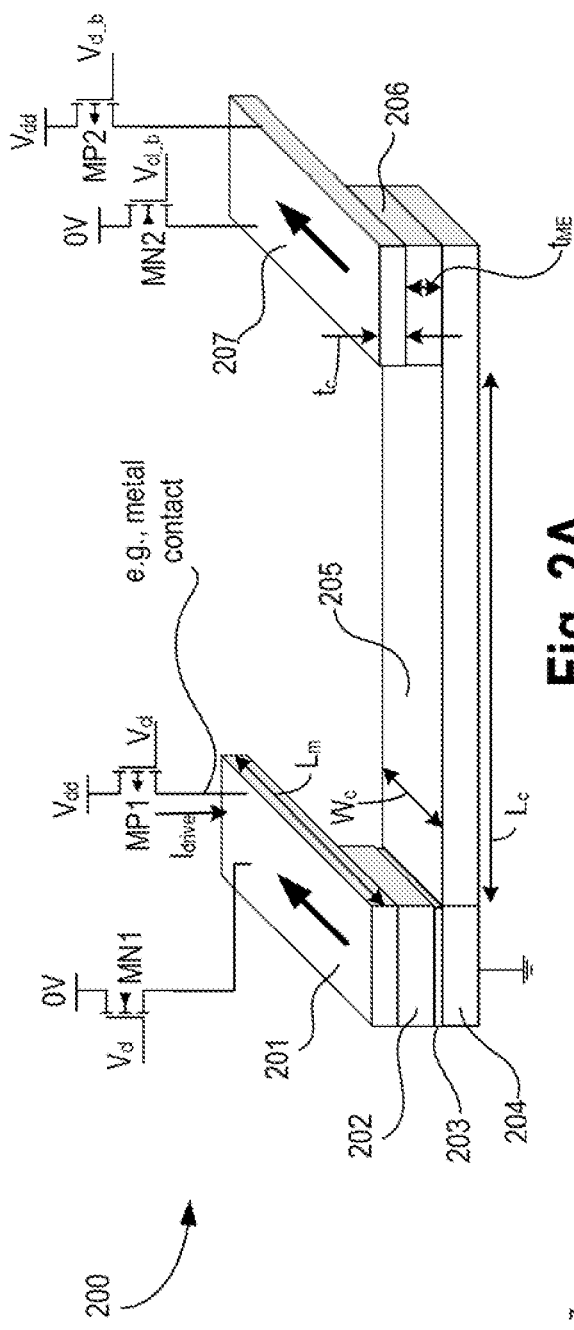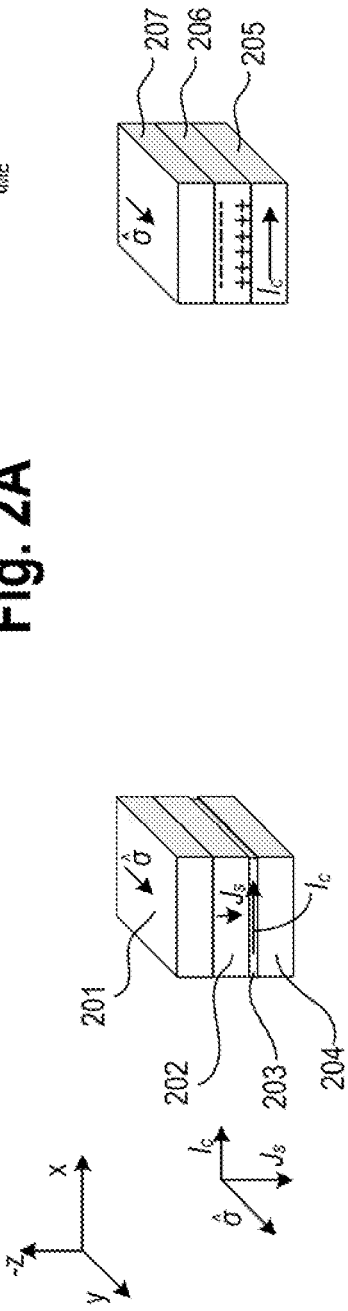
Fig. 2A
Fig. 2B
Fig. 2C

MAGNETOELECTRIC SPIN ORBIT LOGIC WITH PARAMAGNETS

CLAIM OF PRIORITY

This Application is a National Stage Entry of, and claims priority to, PCT Application No. PCT/US16/68594, filed on 23 Dec. 2016 and titled "MAGNETOELECTRIC SPIN ORBIT LOGIC WITH PARAMAGNETS," which is incorporated by reference in its entirety for all purposes.

BACKGROUND

Spintronics is the study of intrinsic spin of the electron and its associated magnetic moment in solid-state devices. Spintronic logic are integrated circuit devices that use a physical variable of magnetization or spin as a computation variable. Such variables can be non-volatile (i.e., preserving a computation state when the power to an integrated circuit is switched off). Non-volatile logic can improve the power and computational efficiency by allowing architects to put a processor to un-powered sleep states more often and therefore reduce energy consumption. Existing spintronic logic generally suffer from high energy and relatively long switching times.

For example, large write current (e.g., greater than 100 µA/bit) and voltage (e.g., greater than 0.7 V) are needed to switch a magnet (i.e., to write data to the magnet) in Magnetic Tunnel Junctions (MTJs). Existing Magnetic Random Access Memory (MRAM) based on MTJs also suffer from high write error rates (WERs) or low speed switching. For example, to achieve lower WERs, switching time is slowed down which degrades the performance of the MRAM. MTJ based MRAMs also suffer from reliability issues due to tunneling current in the spin filtering tunneling dielectric of the MTJs e.g., magnesium oxide (MgO).

Ferromagnetic switching in existing magnetic logic devices suffer from limited speed and limited retention. For example, speed of response of magnetization in ferromagnetic devices is limited by ferromagnetic resonance (FMR) response of the magnets governed by Landau-Lifshitz-Gilbert equation. Retention of a ferromagnet is limited by magnetic energy barrier proportional to volume.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates magnetization response to applied magnetic field for a ferromagnet.

FIG. 1B illustrates magnetization response to applied magnetic field for a paramagnet.

FIG. 1C illustrates magnetization response to applied voltage field for a paramagnet connected to a magnetoelectric layer.

FIG. 2A illustrates a magnetoelectric spin orbit logic using paramagnets, according to some embodiments of the disclosure.

FIG. 2B illustrates a spin orbit material stack at the input of an interconnect, according to some embodiments of the disclosure.

FIG. 2C illustrates a magnetoelectric material stack at the output of an interconnect, according to some embodiments of the disclosure.

DETAILED DESCRIPTION

Figure 3:
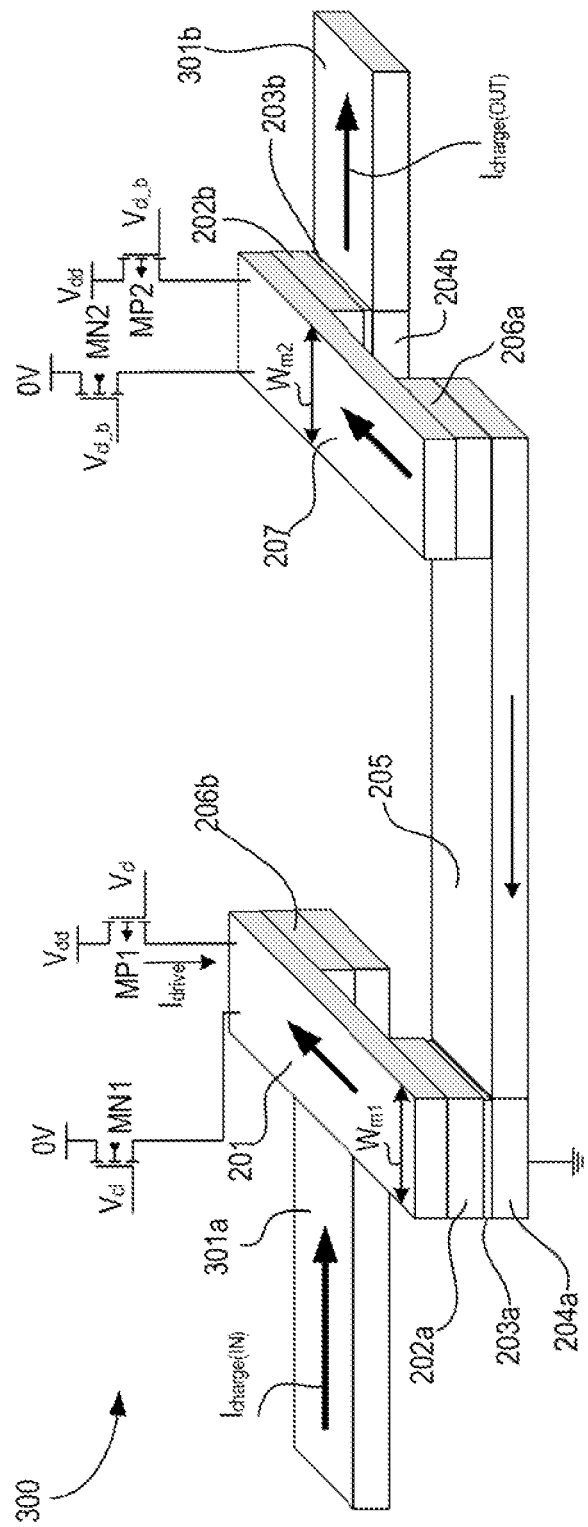
FIG. 3 illustrates a magnetoelectric spin orbit logic, according to some embodiments of the disclosure.

The Magnetoelectric (ME) effect has the ability to manipulate the magnetization (and the associated spin of electrons in the material) by an applied electric field. Since an estimated energy dissipation per unit area per magnet switching event through the ME effect is an order of magnitude smaller than with spin-transfer torque (STT) effect, ME materials have the capability for next-generation memory and logic applications.

Various embodiments describe a paramagnetic Magnetoelectric Spin Orbit Logic (MESO) which is a combination of various physical phenomena for spin-to-charge and charge-to-spin conversion. In some embodiments, spin-to-charge conversion is achieved via a layer with the inverse Rashba-Edelstein effect (or spin Hall effect) wherein a spin current injected from an input magnet produces a charge current. The sign of the charge current is determined by the direction of the injected spin and thus of magnetization. In some embodiments, charge-to-spin conversion is achieved via magnetoelectric effect in which the charge current produces a voltage on a capacitor, comprising a layer with magnetoelectric effect, leading to switching magnetization of an output magnet. In some embodiments, magnetic response of a paramagnet is according to an applied exchange bias from the magnetoelectric effect.

There are many technical effects of various embodiments. For example, high speed operation of the logic (e.g., 100 picoseconds (ps)) is achieved via the use of magnetoelectric switching operating on paramagnetic nanomagnets. In some examples, switching energy is reduced (e.g., 1-10 attojoules (aJ)) because the current needs to be "on" for a shorter time (e.g., approximately 3 ps) in order to charge the capacitor. In some examples, in contrast to the spin current, here charge current does not attenuate when it flows through an interconnect. Other technical effects will be evident from various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A illustrates a magnetization hysteresis plot 100 for ferromagnet 101. The plot shows magnetization response to applied magnetic field for ferromagnet 101. The x-axis of plot 100 is magnetic field 'H' while the y-axis is magnetization 'm'. For ferromagnet (FM) 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetizations. In the zero magnetic field region 105 of the hysteresis loop, FM 101 does not have a definite value of magnetization, but rather depends on the history of applied magnetic fields. For example, the magnetization of FM 101 in configuration 105 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103.

FIG. 1B illustrates magnetization plot 120 for paramagnet 121. Plot 120 shows the magnetization response to applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

FIG. 1C illustrates plot 130 showing magnetization response to applied voltage field for a paramagnet 131 connected to a magnetoelectric layer 132. Here, the x-axis is voltage 'V' applied across ME layer 132 and y-axis is magnetization 'm'. Ferroelectric polarization '$P_{FE}$' is in ME layer 132 is indicated by an arrow. In this example, magnetization is driven by exchange bias exerted by a ME effect from ME layer 132. When positive voltage is applied to ME layer 132, paramagnet 131 establishes a deterministic magnetization (e.g., in the +x direction by voltage +$V_c$) as shown by configuration 136. When negative voltage is applied by ME layer 132, paramagnet 131 establishes a deterministic magnetization (e.g., in the −x direction by voltage −$V_c$) as shown by configuration 134. Plot 130 shows that magnetization functions 133a and 133b have hysteresis. In some embodiments, by combining ME layer 132 with paramagnet 131, switching speeds of paramagnet as shown in FIG. 1B are achieved. In some embodiments, the hysteresis behavior of FM 131, as shown in FIG. 1C, is associated with the driving force of switching rather than the intrinsic resistance of the magnet to switching.

FIG. 2A illustrates a magnetoelectric spin orbit logic (SOL) 200 using paramagnets, according to some embodiments of the disclosure. FIG. 2B illustrates a material stack at the input of an interconnect, according to some embodiments of the disclosure. FIG. 2C illustrates a magnetoelectric SOL material stack at the output of an interconnect, according to some embodiments of the disclosure. It is pointed out that those elements of FIGS. 2A-C having the same reference numbers (or names) as the elements of any other figure can operate or function in any manner similar to that described, but are not limited to such.

In some embodiments, SOL 200 comprises a first paramagnet 201, a stack of layers (e.g., layers 202, 203, and 204) a portion of which is/are adjacent to first paramagnet 201, interconnecting conductor 205 (e.g., a non-magnetic charge conductor), magnetoelectric (ME) layer 206, and second paramagnet 207. In some embodiments, the first and second paramagnets 201 and 207, respectively, have in-plane magnetic anisotropy. In some embodiments, ME layer 206 is adjacent to second paramagnet 207. In some embodiments, conductor 205 (or charge interconnect) is coupled to at least a portion of the stack of layers and ME layer 206. For example, conductor 205 is coupled to layer 204 of the stack.

In some embodiments, the stack of layers is to provide an inverse Rashba-Edelstein effect (or inverse spin Hall effect). In some embodiments, the stack of layers provide spin-to-charge conversion where a spin current $I_s$ (or spin energy $J_s$) is injected from first paramagnet 201 (also referred to as the input magnet) and charge current $I_c$ is generated by the stack of layers. This charge current $I_c$ is provided to conductor 205 (e.g., charge interconnect). In contrast to spin current, charge current does not attenuate in conductor 205. The direction of the charge current $I_c$ depends on the direction of magnetization of first paramagnet 201. In some embodiments, the charge current $I_c$ charges the capacitor around ME layer 206 and switches its polarization. ME layer 207 exerts exchange bias on second paramagnet layer 207, and the direction of the exchange bias determines the magnetization of second paramagnet 207.

In this example, the length of first paramagnet is $L_m$, the width of conductor 205 is $W_c$, the length of conductor 205 from the interface of layer 204 to ME layer 206 is $L_c$, $t_c$ is the thickness of the paramagnets 201 and 207, and $t_{ME}$ is the thickness of ME layer 206. In some embodiments, conductor 205 is formed of a material selected from a group consisting of: Cu, Ag, Al, and Au. In some embodiments, a transistor (e.g., p-type transistor MP1) is coupled to first paramagnet 201. In this example, the source terminal of MP1 is coupled to a supply $V_{dd}$, the gate terminal of MP1 is coupled to a control voltage $V_{cl}$ (e.g., a switching clock signal, which switches between $V_{dd}$ and ground), and the drain terminal of MP1 is coupled to first paramagnet 201. The current $I_{drive}$ from transistor MP1 causes first paramagnet 201 to generate spin current into the stack of layers (e.g., layers 202, 203, and 204).

In some embodiments, along with the p-type transistor MP1 connected to $V_{dd}$ (or an n-type transistor connected to $V_{dd}$ but with gate overdrive above $V_{dd}$), an n-type transistor MN1 is provided which couples to magnet 201, where the n-type transistor is operable to couple ground (or 0V) to magnet 201. In some embodiments, n-type transistor MN2 is provided which is operable to couple ground (or 0V) to magnet 207. In some embodiments, p-type transistor MP2 is provided which is operable to couple power supply (Vdd or –Vdd) to magnet 207. For example, when clock is low (e.g., $V_{cl}$=0V), then transistor MP1 is on and $V_{dd}$ is coupled to input magnet 201 (e.g., power supply is $V_{dd}$) and 0V is coupled to output magnet 207. This provides a path for charge current to flow. Continuing with this example, when clock is high (e.g., $V_{cl}$=$V_{dd}$ and power supply is $V_{dd}$), then transistor MP1 is off, transistor MN1 is on, and transistor MN2 is off. As such, 0V is coupled to input magnet 201. In some embodiments, the power supply is a negative power supply (e.g., –$V_{dd}$). In that case, then transistor MP1's source is connected to 0V, and transistor MN1's source is connected to –$V_{dd}$, and transistor MN2 is on. When $V_{cl}$=0V and power supply is –$V_{dd}$, then transistor MN1 is on, and transistor MP1 is off, and transistor MN2 (whose source is at –$V_{dd}$) is off and MP2 whose source is 0V is on. In this case, –$V_{dd}$ is coupled to input magnet 201 and 0V is coupled to output magnet 207. This also provides a path for charge current to flow. Continuing with this example, when clock is high (e.g., $V_{cl}$=$V_{dd}$ and power supply is –$V_{dd}$), then transistor MP1 is off, transistor MN1 is on, and transistor MN2 is off. As such, 0V is coupled to input magnet 201.

In some embodiments, ME layer 206 forms a magnetoelectric capacitor to switch the magnets. For example, the conductor 205 forms one plate of the capacitor, magnet 207 forms the other plate of the capacitor, and layer 206 is the magnetic-electric oxide that provides out-of-plane exchange bias to magnet 207. In some embodiments, the magnetoelectric oxide comprises perpendicular exchange bias due to partially compensated anti-ferromagnetism.

The first paramagnet 201 injects a spin polarized current into the high spin-orbit coupling (SOC) material stack (e.g., layers 202, 203, and 204). The spin polarization is determined by the magnetization of first paramagnet 201. In some embodiments, the stack comprises i) an interface 203 with a high density 2D (two dimensional) electron gas and with high SOC formed between 202 and 204 materials such as Ag or Bi, or ii) a bulk material 204 with high Spin Hall Effect (SHE) coefficient such as Ta, W, or Pt. In some embodiments, a spacer (or template layer) is formed between first paramagnet 201 and the injection stack. In some embodiments, this spacer is a templating metal layer which provides a template for forming first paramagnet 201. In some embodiments, the metal of the spacer which is directly coupled to first paramagnet 201 is a noble metal (e.g., Ag, Cu, or Au) doped with other elements from Group 4d and/or 5d of the Periodic Table. In some embodiments, first paramagnet 201 are sufficiently lattice matched to Ag (e.g., a material which is engineered to have a lattice constant close (e.g., within 3%) to that of Ag).

Here, sufficiently matched atomistic crystalline layers refer to matching of the lattice constant 'a' within a threshold level above which atoms exhibit dislocation which is harmful to the device (for instance, the number and character of dislocations lead to a significant (e.g., greater than 10%) probability of spin flip while an electron traverses the interface layer). For example, the threshold level is within 5% (i.e., threshold levels in the range of 0% to 5% of the relative difference of the lattice constants). As the matching improves (i.e., matching gets closer to perfect matching), spin injection efficiency from spin transfer from first paramagnet 201 to first ISHE/ISOC stacked layer increases. Poor matching (e.g., matching worse than 5%) implies dislocation of atoms that is harmful for the device.

Table 1 summarizes transduction mechanisms for converting magnetization to charge current and charge current to magnetization for bulk materials and interfaces.

TABLE 1

Transduction mechanisms for Spin to Charge and Charge to Spin Conversion

| | Spin → Charge | Charge → Spin |
|---|---|---|
| Bulk | Inverse Spin Hall Effect | Magnetoelectric effect |
| Interface | Inverse Rashba-Edelstein Effect | Magnetoelectric effect |

In some embodiments, the spin-orbit mechanism responsible for spin-to-charge conversion is described by the inverse Rashba-Edelstein effect in 2D electron gases. The Hamiltonian (energy) of spin-orbit coupling electrons in a 2D electron gas is:

$$H_R = \alpha_R(k \times \hat{z}) \cdot \vec{\sigma}$$

where $\alpha_R$ is the Rashba-Edelstein coefficient, 'k' is the operator of momentum of electrons, $\hat{z}$ is a unit vector perpendicular to the 2D electron gas, and $\vec{\sigma}$ is the operator of spin of electrons.

The spin polarized electrons with direction of polarization in-plane (e.g., in the xy-plane) experience an effective magnetic field dependent on the spin direction:

$$\vec{B}(k) = \frac{\alpha_R}{\mu_B}(\vec{k} \times \hat{z})$$

where $\mu_B$ is the Bohr magneton

This results in the generation of a charge current $I_c$ in interconnect 205 proportional to the spin current $I_s$ (or $J_s$). The spin-orbit interaction by Ag and Bi interface layers 202 and 204 (e.g., the Inverse Rashba-Edelstein Effect (IREE)) produces a charge current $I_c$ in the horizontal direction given as:

$$I_c = \frac{\lambda_{IREE} I_s}{w_m}$$

where $W_m$ is width of the input paramagnet magnet 201, and $\lambda_{IREE}$ is the IREE constant (with units of length) proportional to $\alpha_R$.

Alternatively, the Inverse Spin Hall Effect in Ta, W, or Pt layer 203 produces the horizontal charge current $I_c$ given as:

$$I_c = \frac{\Theta_{SHE} t_{SHE} I_s}{2 w_m}$$

Both IREE and ISHE effects produce spin-to-charge current conversion around 0.1 with existing materials at 10 nm (nanometers) magnet width. For scaled nanomagnets (e.g., 5 nm wide magnets) and exploratory SHE materials such as $Bi_2Se_3$, the spin-to-charge conversion efficiency can be between 1 and 2.5. The net conversion of the drive charge current $I_{drive}$ to magnetization dependent charge current is given as:

$$I_c = \pm \frac{\lambda_{IREE} P I_s}{w_m} \text{ for IREE and } I_c = \pm \frac{\Theta_{SHE} t_{SHE} P I_s}{2 w_m} \text{ for ISHE}$$

where 'P' is the dimensionless spin polarization. For this estimate, the drive current $I_{drive}$ and the charge current $I_c = I_d = 100$ µA is set. As such, when estimating the resistance of the ISHE interface to be equal to R=100Ω, then the induced voltage is equal to $V_{ISHE}$=10 mV.

The charge current $I_c$, carried by interconnect 205, produces a voltage on the capacitor of ME layer 206 comprising magnetoelectric material dielectric (such as $BiFeO_3$ (BFO) or $Cr_2O_3$) in contact with second paramagnet 207 (which serves as one of the plates of the capacitor) and interconnect 205 (which series as the other of the plates of the capacitor).

In some embodiments, magnetoelectric materials are either intrinsic multiferroic or composite multiferroic structures. As the charge accumulates on the magnetoelectric capacitor of ME layer 206, a strong magnetoelectric interaction causes the switching of magnetization in second paramagnet 207. For the following parameters of the magnetoelectric capacitor: thickness $t_{ME}$=5 nm, dielectric constant ε=500, area A=60 nm×20 nm. Then the capacitance is given as:

$$C = \frac{\varepsilon \varepsilon_0 A}{t_{ME}} \approx 1 fF$$

Demonstrated values of the magnetoelectric coefficient is $\alpha_{ME}$~10/c, where the speed of light is c. This translates to the effective magnetic field exerted on second paramagnet 207, which is expressed as:

$$B_{ME} = \alpha_{ME} E = \frac{\alpha_{ME} V_{ISHE}}{t_{ME}} \sim 0.06T$$

This is a strong field sufficient to switch magnetization.
The charge on the capacitor of ME layer 206 is $$Q = \frac{1}{fF} \times 10 \text{ mV} = 10 \text{ aC,}$$

and the time to fully charge it to the induced voltage is $$td = 10\frac{Q}{I_d} \sim 1 \text{ ps}$$

(with the account of decreased voltage difference as the capacitor charges). If the driving voltage is $V_d$=100 mV, then the energy $E_{SW}$ to switch is expressed as:

$$E_{SW} \sim 100 \text{ mV} \times 100 \mu A \times 1 \text{ ps} \sim 10 \text{ aJ}$$

which is comparable to the switching energy of CMOS transistors. Note that the time to switch $t_{SW}$ magnetization remains much longer than the charging time and is determined by the magnetization precession rate. The micromagnetic simulations predict this time to be $t_{SW}$~100 ps, for example.

In some embodiments, materials for first and second paramagnets 201 and 207 have saturated magnetization $M_s$ and effective anisotropy field $H_k$. Saturated magnetization $M_s$ is generally the state reached when an increase in applied external magnetic field H cannot increase the magnetization of the material. Anisotropy $H_k$ generally refers material properties that are highly directionally dependent. In some embodiments, materials for first and second paramagnets 201 and 207 are non-ferromagnetic elements with strong paramagnetism which have high number of unpaired spins but are not room temperature ferromagnets.

In some embodiments, first and second paramagnets 201 and 207 comprise a material selected from a group consisting of: Platinum(Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), and $V_2O_3$ (Vanadium oxide). In some embodiments, the first and second paramagnets 201 and 207 comprise dopants selected from a group consisting of: Ce, Cr, Mn, Nb, Mo, Tc, Re, Nd, Gd, Tb, Dy, Ho, Er, Tm, and Yb.

In some embodiments, the stack of layers comprises: a first layer 202 comprising Ag, wherein the first layer is adjacent to first paramagnet 201; and a second layer 204 comprising Bi or W, wherein second layer 204 is adjacent to first layer 202 and to conductor 205. In some embodiments, a third layer 203 (having material which is one or more of Ta, W, or Pt) is sandwiched between first layer 202 and second layer 204 as shown. In some embodiments, the stack of layers comprises a material selected from a group consisting of: β-Ta, β-W, W, Pt, Cu doped with Iridium, Cu doped with Bismuth, and Cu doped an element of 3d, 4d, 5d, 4f, or 5f of periodic table groups.

In some embodiments, ME layer 206 is formed of a material selected from a group consisting of: $Cr_2O_3$ and multiferroic material. In some embodiments, ME layer 206 comprises Cr and O. In some embodiments, the multiferroic material comprises BFO (e.g., $BiFeO_3$).

FIG. 3 illustrates paramagnetic SOL 300, according to some embodiments of the disclosure. It is pointed out that those elements of FIG. 3 having the same reference numbers (or names) as the elements of any other figure can operate or function in any manner similar to that described, but are not limited to such. SOL 300 is similar to SOL 200 but for the input and output charge conductors and associated spin-to-charge and charge-to-spin converters. In some embodiments, input charge current $I_{charge(IN)}$ is provided on interconnect 301a (e.g., charge interconnect made of same material as interconnect 205). In some embodiments, interconnect 301a is coupled to first paramagnet 201 via ME layer 206b (note ME layer 206 is now labeled as ME Layer 206a). In some embodiments, interconnect 301a is orthogonal to first paramagnet 201. For example, interconnect 301a extends in the +x direction while first paramagnet 201 extends in the −y direction. In some embodiments, $I_{charge(IN)}$ is converted to corresponding magnetic polarization of 201 by ME layer 206b. The materials for ME layers 206a/b are the same as the materials of ME layer 206 described with reference to FIG. 2.

Referring back to FIG. 3, in some embodiments, an output interconnect 301b is provided to transfer output charge current $I_{charge(OUT)}$ to another logic or stage. In some embodiments, output interconnect 301b is coupled to second paramagnet 207 via a stack of layers that exhibit spin Hall effect and/or Rashba Edelstein effect. For example, layers 202b, 203b, and 204b are provided as a stack to couple output interconnect 301b with second paramagnet 207. Note layers 202, 203, and 204 are now labeled as layers 202a, 203a, and 204a, respectively. Material wise, layers 202b, 203b, and 204b are formed of the same material as layers 202a, 203a, and 204a, respectively.

Figure 4:
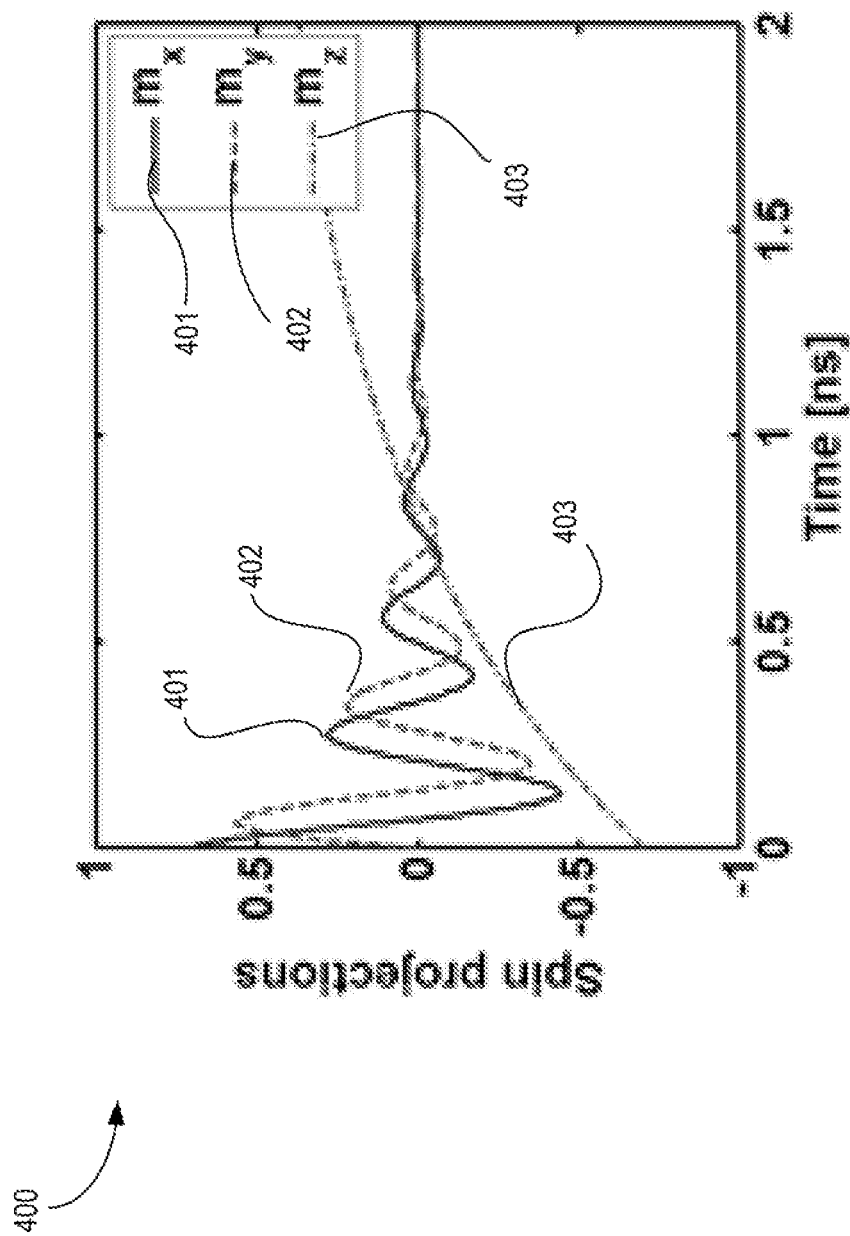
FIG. 4 illustrates a plot showing spin projections in a paramagnet over time.

FIG. 4 illustrates plot 400 showing magnetization or spin projections in a paramagnet over time. Here, x-axis is time (in nano-seconds) and y-axis is spin projections. Plot 400 shows the magnetization 'm' in the x-direction ($m_x$ 401), y-direction ($m_y$ 402), and z-direction ($m_z$ 403). In the absence of external magnetic field 'H' these magnetization projections decay towards zero over characteristic times: longitudinal relaxation time $T_1$ for projection $m_z$ and transverse relaxation time $T_2$ for projections $m_x$ and $m_y$. The times may be significantly shorter than characteristic response time of FM (ferromagnet) 101 which is governed by Landau-Lifshitz-Gilbert (LLG) equation based dynamics.

Figure 5:
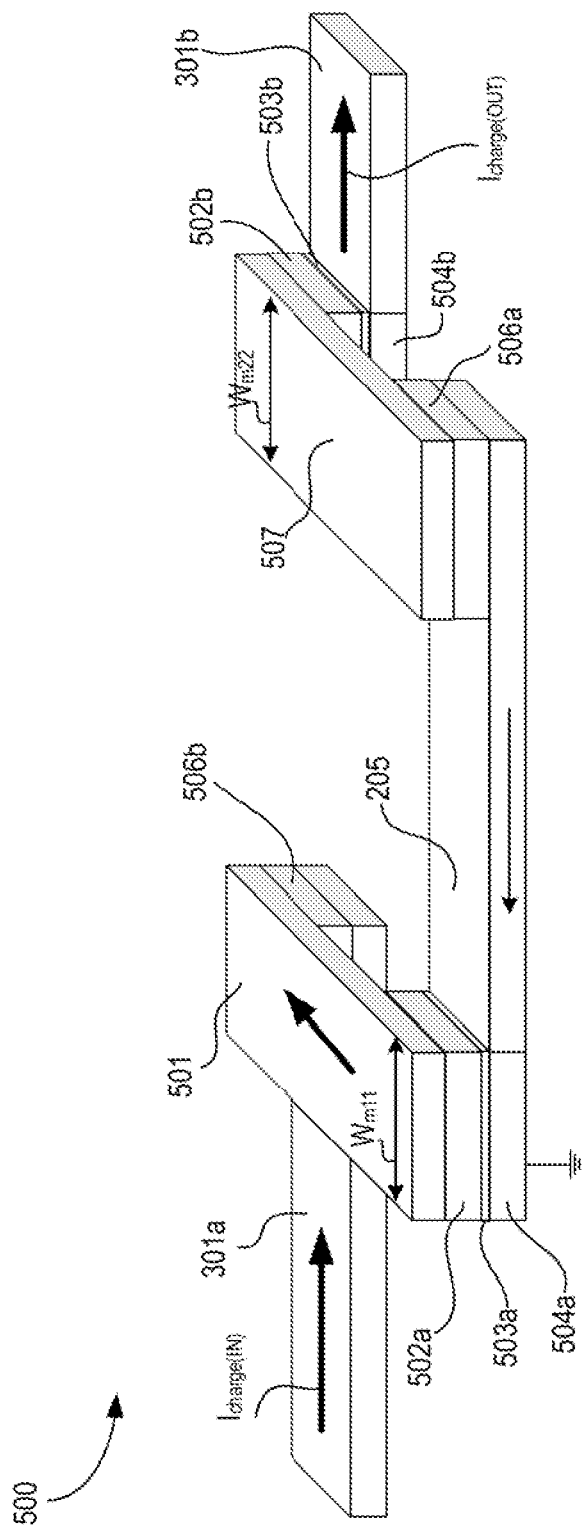
FIG. 5 illustrates a magnetoelectric spin orbit logic with relaxed aspect ratios, according to some embodiments of the disclosure.

FIG. 5 illustrates paramagnetic SOL 500 with relaxed aspect ratios, according to some embodiments of the disclosure. In FM 101, the value of anisotropy and thus of stability of its magnetization configuration was dictated by its shape, i.e. aspect ratios. In some embodiments, paramagnets 501 and 507 do not need to possess a certain value of anisotropy. It is pointed out that those elements of FIG. 5 having the same reference numbers (or names) as the elements of any other figure can operate or function in any manner similar to that described, but are not limited to such. Compared to SOL 300, here SOL 500 has wider first and second paramagnets 501 and 507, respectively. In this example, the width $W_{m11}$ of first paramagnet 501 is larger than the width $W_{m1}$ of first paramagnet 201, and the width $W_{m22}$ of first paramagnet 507 is larger than the width $W_{m2}$ of first paramagnet 207. One reason for having relaxed aspect ratios for SOL 500 is that the magnetization of paramagnets are not dependent of shape of the magnet (e.g., aspect ratio plays little to no role in the magnetization direction of paramagnets as opposed to ferromagnets). This allows SOL logic of various embodiments to have arbitrary shape, which provides more design flexibility compared to SOL logic using FMs.

Figure 6:
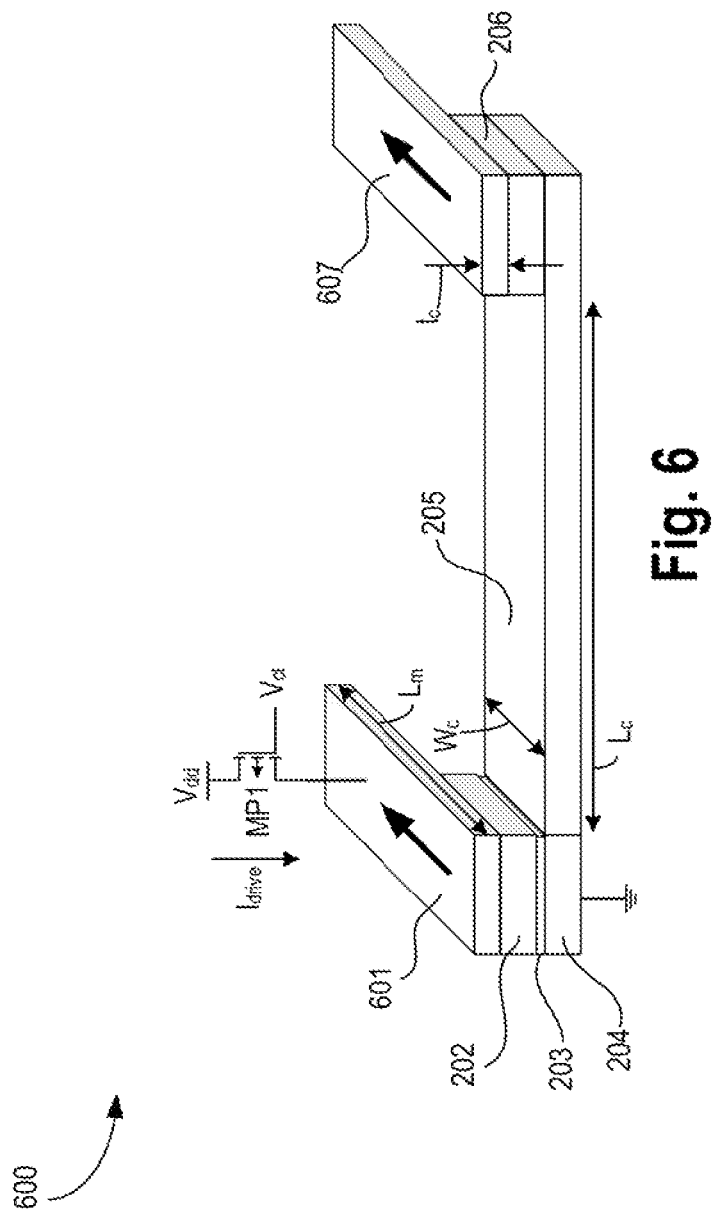
FIG. 6 illustrates a magnetoelectric spin orbit logic with doped paramagnets, according to some embodiments of the disclosure.

FIG. 6 illustrates paramagnetic SOL 600 with doped paramagnets, according to some embodiments of the disclosure. It is pointed out that those elements of FIG. 6 having the same reference numbers (or names) as the elements of any other figure can operate or function in any manner similar to that described, but are not limited to such.

SOL 600 is similar to SOL 200 except that first paramagnet 201 is replaced with a doped first paramagnet 601, and second paramagnet 207 is replaced with a doped second paramagnet 607. The same idea can apply to SOL 300 and SOL 500, where the paramagnets are replaced with doped paramagnets in accordance with some embodiments. The relaxation time of a paramagnet is improved (e.g., made shorter) by doping with materials with stronger dissipation elements to promote Spin-lattice relaxation time ($T_1$) and Spin-spin relaxation time ($T_2$). Here, the term "Spin-lattice relaxation time ($T_1$)" generally refers to the mechanism by which the component of the magnetization vector along the direction of the static magnetic field reaches thermodynamic equilibrium with its surroundings. Here, the term "Spin-spin relaxation time ($T_2$)" generally refers to a spin-spin relaxation is the mechanism by which, the transverse component of the magnetization vector, exponentially decays towards its equilibrium value.

Figure 7A:
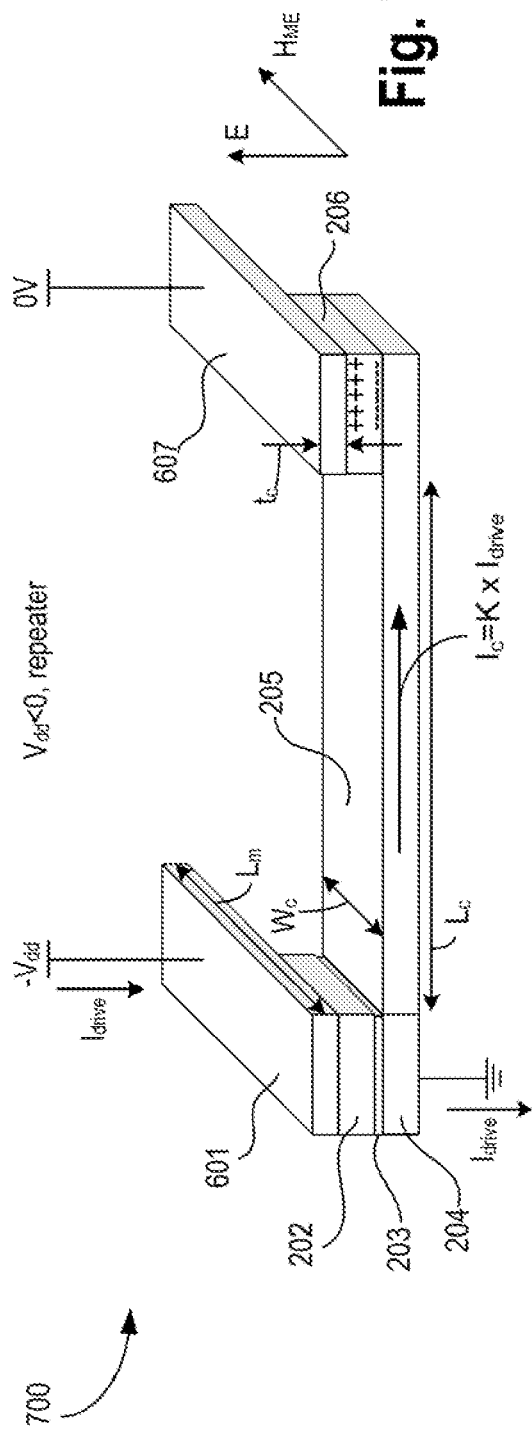
FIG. 7A illustrates a magnetoelectric spin orbit logic operable as a repeater, according to some embodiments.

FIG. 7A illustrates magnetoelectric SOL 700 operable as a repeater (or buffer), according to some embodiments. It is pointed out that those elements of FIG. 7A having the same reference numbers (or names) as the elements of any other figure can operate or function in any manner similar to that described, but are not limited to such. In some embodiments, to configure the SOL as a repeater, a portion of the stack of the layers (e.g., layer 204) is coupled to ground, first paramagnet 201/601 (input magnet) is coupled to a negative supply (e.g., −Vdd), and second paramagnet 607 (output magnet) is coupled to ground (e.g., 0V). In some embodiments, for repeater SOL 700, the magnetization direction of first paramagnet 201/601 is the same as the magnetization direction of second paramagnet 207/607. For example, the magnetization direction of first paramagnet 201/601 is in the +y direction while the magnetization direction of second paramagnet 207/607 is also in the +y direction.

Figure 7B:
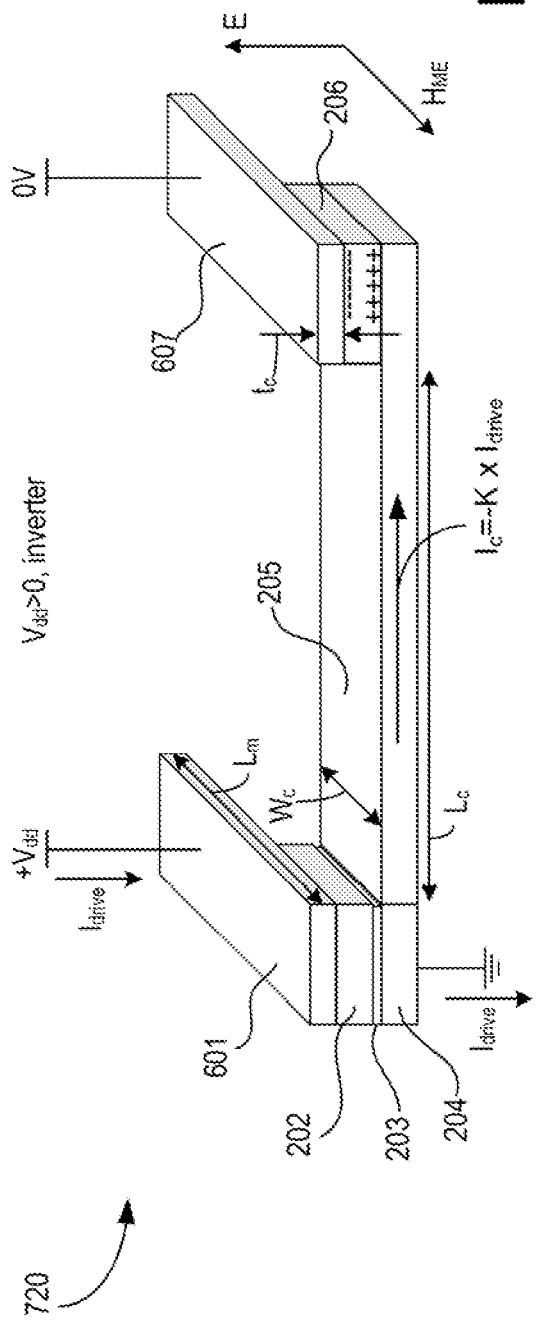
FIG. 7B illustrates a magnetoelectric spin orbit logic operable as an inverter, according to some embodiments.

FIG. 7B illustrates magnetoelectric SOL 720 operable as an inverter, according to some embodiments. It is pointed out that those elements of FIG. 7A having the same reference numbers (or names) as the elements of any other figure can operate or function in any manner similar to that described, but are not limited to such. In some embodiments, to configure the SOL as a repeater, a portion of the stack of the layers (e.g., layer 204) is coupled to ground, first paramagnet 201/601 (input magnet) is coupled to a positive supply (e.g., +Vdd), and second paramagnet 607 (output magnet) is coupled to ground (e.g., 0V). In some embodiments, for inverter SOL 720, the magnetization direction of first paramagnet 201/601 is opposite compared to the magnetization direction of second paramagnet 207/607. For example, the magnetization direction of first paramagnet 201/601 is in the +y direction while the magnetization direction of second paramagnet 207/607 is in the −y direction.

SOL devices of various embodiments provide logic cascadability and unidirectional signal propagation (e.g., input-output isolation). The unidirectional nature of logic is ensured due to large difference in impedance for injection path versus detection path, in accordance with some embodiments. In some embodiments, the injector is essentially a metallic spin valve with spin to charge transduction with RA (resistance area) products of approximately 10 mOhm.micron$^2$. In some embodiments, the detection path is a low leakage capacitance with RA products much larger than 1 MOhm.micron$^2$ in series with the resistance of the FM capacitor plate with estimated resistance greater than 500 Ohms.

Figure 8:
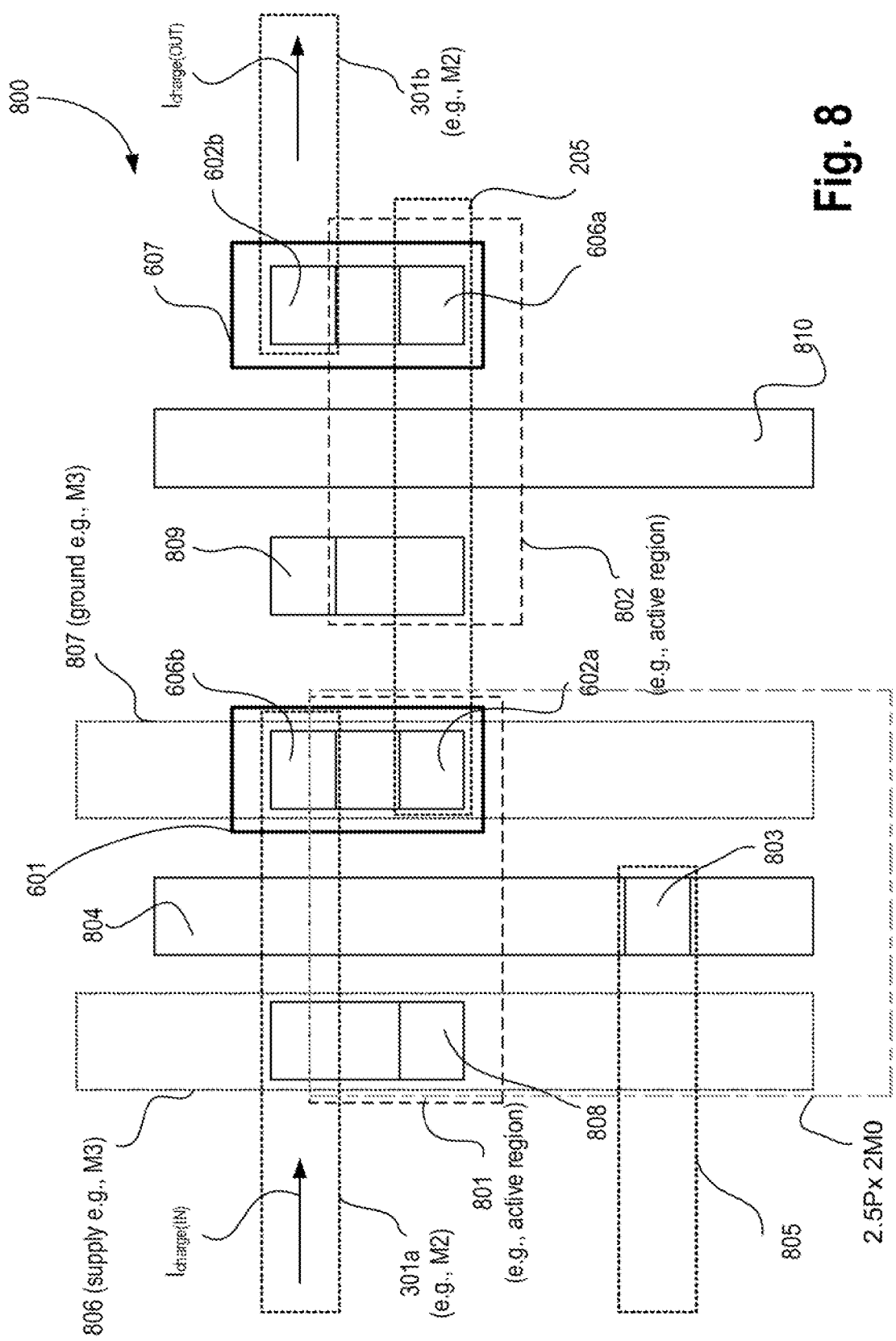
FIG. 8 illustrates a top view of a layout of the magnetoelectric spin orbit logic, according to some embodiments.

FIG. 8 illustrates a top view of layout 800 of magnetoelectric SOL 600, according to some embodiments. An integration scheme for SOL devices with CMOS drivers for power supply and clocking is shown in the top view. Here, transistor MP1 is formed in the active region 801, and power supply is provided via metal layer 3 (M3) indicated as 806. The gate terminal 804 of transistor MP1 is coupled to a supply interconnect 805 through via or contact 803. In some embodiments, M3 layer 807 is coupled to ground which provides ground supply to layer 204. In some embodiments, another transistor can be formed in active region 803 with gate terminal 810. Here, 808 and 809 are contact vias coupled to power supply line. In some embodiments, the density of integration of the devices exceeds that of CMOS since an inverter operation can be achieved within 2.5 P×2M0. In some embodiments, since the power transistor MP1 can be shared among all the devices at the same clock phases, vertical integration can also be used to increase the logic density as described with reference to FIG. 9, in accordance with some embodiments.

Figure 9:
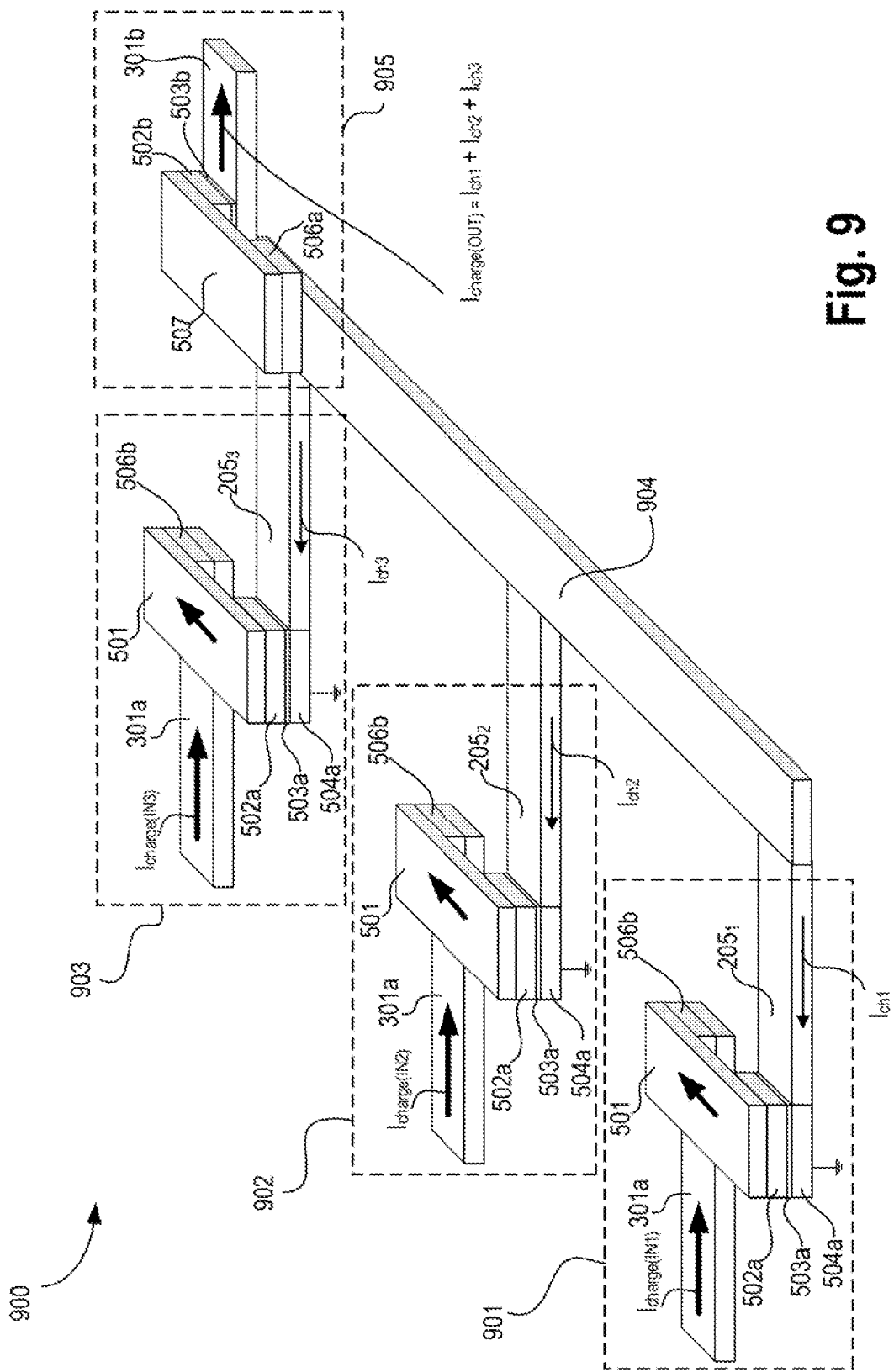
FIG. 9 illustrates a majority gate using magnetoelectric spin orbit logic devices, according to some embodiments.

FIG. 9 illustrates majority gate 900 using magnetoelectric SOL devices, according to some embodiments. It is pointed out that those elements of FIG. 9 having the same reference numbers (or names) as the elements of any other figure can operate or function in any manner similar to that described, but are not limited to such. A charge mediated majority gate is proposed using the spin orbit coupling and magnetoelectric switching. A charge mediated majority gate is shown in FIG. 9. Majority gate 900 comprises at least three input stages 901, 902, and 903 with their respective charge conductors 2051, 2052, and 2053 coupled to summing interconnect 904. In some embodiments, summing interconnect 904 is made of the same materials as interconnect 205. In some embodiments, summing interconnect 904 is coupled to output stage 905 which includes the second paramagnet 507. The three input stages 901, 902, and 903 share a common power/clock region therefore the power/clock gating transistor can be shared among the three inputs of the majority gate, in accordance with some embodiments. The input stages 901, 902, and 903 can also be stacked vertically to improve the logic density, in accordance with some embodiments. The charge current at the output ($I_{charge(OUT)}$) is the sum of currents $I_{ch1}$, $I_{ch2}$, and $I_{ch3}$.

Figure 10:
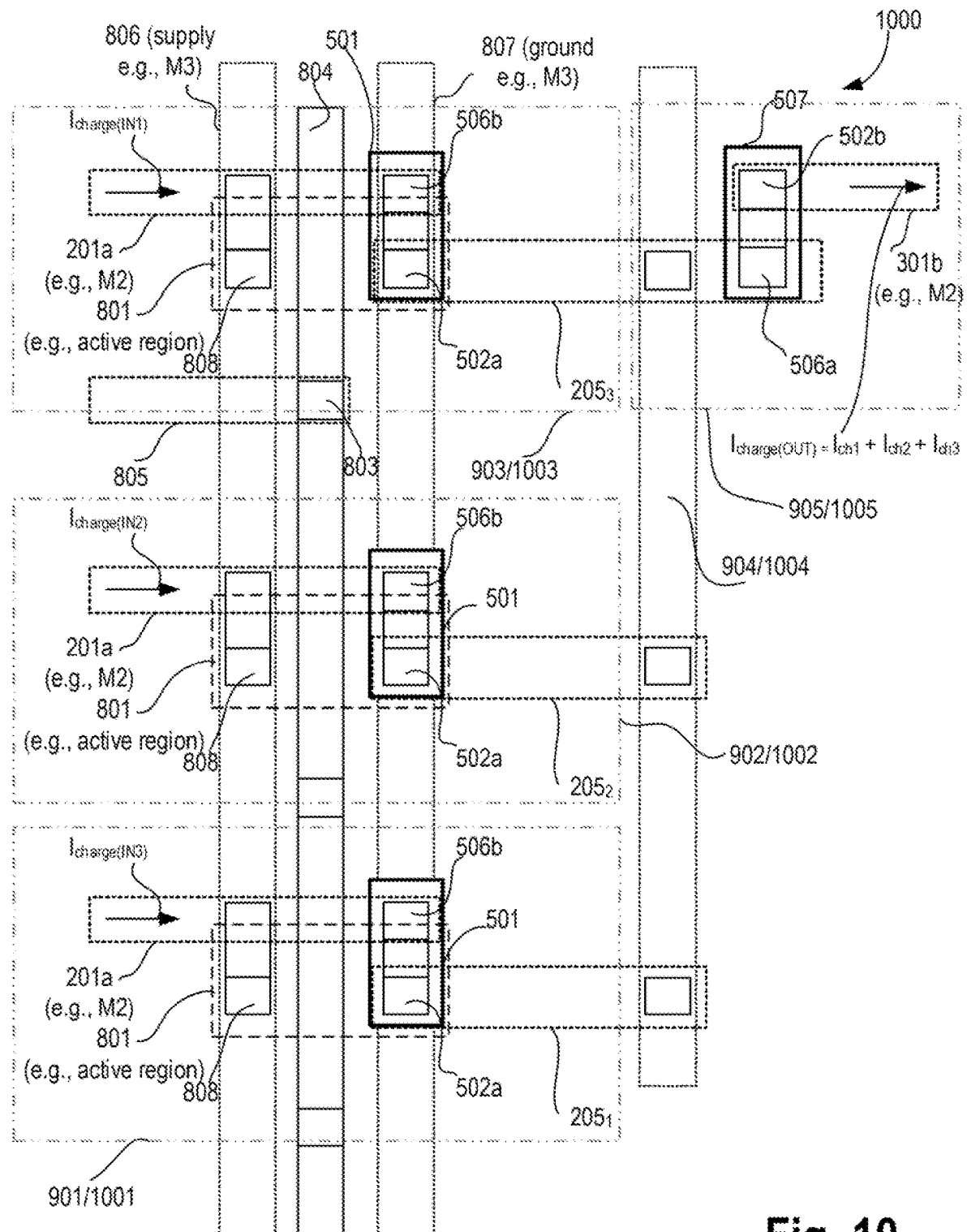
FIG. 10 illustrates a top view of a layout of the majority gate of FIG. 9, according to some embodiments.

FIG. 10 illustrates a top view of layout 1000 of the majority gate, according to some embodiments. It is pointed out that those elements of FIG. 10 having the same reference numbers (or names) as the elements of any other figure can operate or function in any manner similar to that described, but are not limited to such. Majority gate 1000 comprises at least three input stages 901/1001, 902/1002, and 903/1003 with their respective conductors 2051, 2052, and 2053 coupled to summing interconnect 904/1002.

Figure 11:
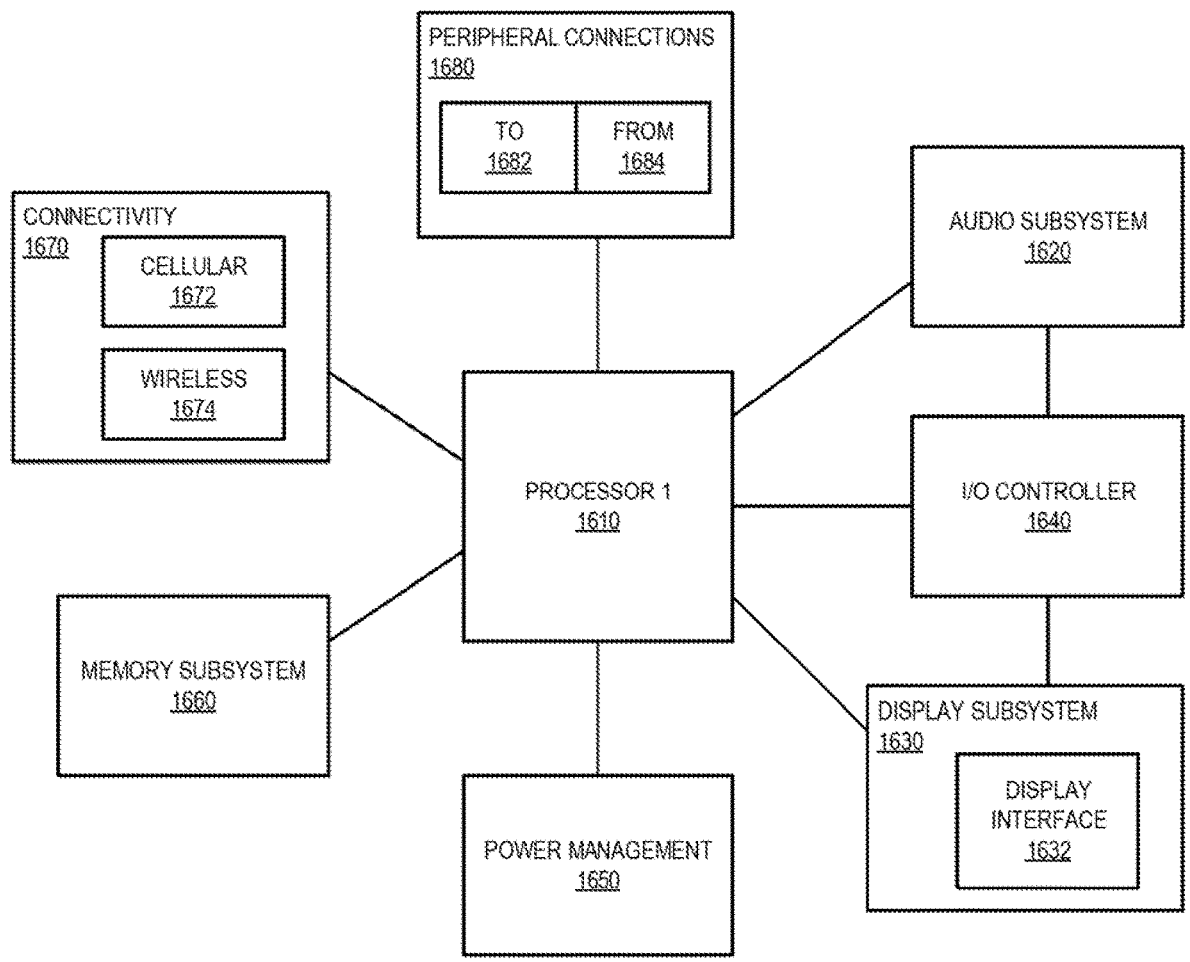
FIG. 11 illustrates a smart device or a computer system or a SoC (System-on-Chip) with Magnetoelectric Spin Orbit Logic, according to some embodiments.

FIG. 11 illustrates a smart device or a computer system or a SoC (System-on-Chip) with Magnetoelectric Spin Orbit Logic, according to some embodiments. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with magnetoelectric SOL, according to some embodiments discussed. Other blocks of the computing device 1600 may also include a magnetoelectric SOL, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus which comprises: a first paramagnet; a stack of layers, a portion of which is adjacent to the first paramagnet, wherein the stack of layers is to provide an inverse spin-orbit coupling effect; a second paramagnet; a magnetoelectric layer adjacent to the second paramagnet; and a conductor coupled to at least a portion of the stack of layers and the magnetoelectric layer.

Example 2 includes features of example 1, wherein the first and second paramagnets comprises a material which includes one or more of: Pt, Pd, W, Ce, Al, Li, Mg, Na, $Cr_2O_3$, CoO, Dy, $Dy_2O$, Er, $Er_2O_3$, Eu, $Eu_2O_3$, Gd, $Gd_2O_3$, FeO, $Fe_2O_3$, Nd, $Nd_2O_3$, $KO_2$, Pr, Sm, $Sm_2O_3$, Tb, $Tb_2O_3$, Tm, $Tm_2O_3$, V, or $V_2O_3$.

Example 3 includes features according any one of examples 1 or 2, wherein the stack of layers comprises: a first layer comprising Ag, wherein the first layer is adjacent to the first paramagnet; and a second layer comprising Bi, wherein the second layer is adjacent to the first layer and to the conductor.

Example 4 includes features according to any one of examples 1 or 2, wherein the stack of layers comprises: a first layer comprising Ag, wherein the first layer is adjacent to the first paramagnet; and a second layer comprising W, wherein the second layer is adjacent to the first layer and to the conductor.

Example 5 includes features of example 1, wherein the conductor comprises a material which includes one or more of: Cu, Ag, Al, or Au.

Example 6 includes features of example 1, wherein the magnetoelectric layer comprises a material which includes one of: Cr, O, $Cr_2O_3$ or multiferroic material.

Example 7 includes features of example 6, wherein the multiferroic material comprises $BiFeO_3$.

Example 8 includes features of example 1, wherein the stack of layers comprises a material which comprises one or more of: β-Ta, β-W, W, Pt, Cu doped with Iridium, Cu doped with Bismuth, or Cu doped an element of 3d, 4d, 5d, 4f, or 5f of periodic table groups.

Example 9 includes features of example 1 which comprises a transistor coupled to the first paramagnet.

Example 10 includes features of example 1, wherein a portion of the stack of the layers is coupled to ground, wherein the first paramagnet is coupled to a negative supply, and wherein the second paramagnet is coupled to ground.

Example 11 includes features of example 1, wherein a portion of the stack of the layers is coupled to ground, wherein the first paramagnet is coupled to a positive supply, and wherein the second paramagnet is coupled to ground.

Example 12 includes features of example 1, wherein the first and second paramagnets have in-plane magnetic anisotropy.

Example 13 is an apparatus which comprises: a first paramagnet having a first portion and a second portion; a first stack of layers, a portion of which is adjacent to the first portion of the first paramagnet, wherein the first stack of layers is to provide an inverse spin orbit coupling effect; a first magnetoelectric layer adjacent to the second portion of first paramagnet; a first conductor adjacent to the first magnetoelectric layer; a second conductor adjacent to at least a portion of the first stack of layers; a second paramagnet having a first portion and a second portion; a second stack of layers adjacent to the first portion of the second paramagnet, wherein the second stack of layers is to provide an inverse spin orbit coupling effect; a second magnetoelectric layer adjacent to the second portion of the second paramagnet; a second conductor adjacent to the second magnetoelectric layer; a third conductor adjacent to at least a portion of the second stack of layers; a third paramagnet having a first portion and a second portion; a third stack of layers, a portion of which is adjacent to the first portion of the third paramagnet, wherein the third stack of layers is to provide an inverse spin-orbit coupling effect; a third magnetoelectric layer adjacent to the second portion of the third paramagnet; a third conductor adjacent to the third magnetoelectric layer; a fourth conductor adjacent to at least a portion of the third stack of layers; and a fifth conductor coupled to the second, third, and fourth conductors.

Example 14 includes features of example 13 wherein the apparatus of example 13 comprises: a fourth paramagnet having a first portion and a second portion; a fourth stack of layers, a portion of which is adjacent to the first portion of the fourth paramagnet, wherein the fourth stack of layers is to provide an inverse spin-orbit coupling effect; a sixth conductor adjacent to at least a portion of the fourth stack of layers; and a fourth magnetoelectric layer adjacent to the second portion of the fourth paramagnet, wherein the fourth magnetoelectric layer is adjacent to the fifth conductor.

Example 15 includes features of example 14, wherein the first, second, third, and fourth paramagnets comprise a material which includes one or more of: Platinum, Palladium, Tungsten, Cesium, Aluminum, Lithium, Magnesium, or Sodium.

Example 16 includes features of example 14, wherein the first, second, third, and fourth paramagnets comprises dopants which comprises one or more of: Cr, Mn, Nb, Mo, Tc, Re, Nd, Gd, Tb, Dy, Ho, Er, Tm, or Yb.

Example 17 includes features of example 14, wherein the first, second, third, and fourth magnetoelectric layers are formed of a material which comprises one or more of: $Cr_2O_3$ or multiferroic material.

Example 18 includes features of example 17, wherein the multiferroic material comprises $BiFeO_3$.

Example 19 includes features of example 14, wherein the first, second, third, and fourth stack of layers comprises a material which includes one or more of: $\beta$-Ta, $\beta$-W, W, Pt, Cu doped with Iridium, Cu doped with Bismuth, or Cu doped an element of 3d, 4d, 5d, 4f, or 5f of periodic table groups.

Example 20 is a system which comprises a memory; a processor coupled to the memory, the processor including an apparatus according to any one of apparatus of examples 1 to 12 or apparatus of examples 13 to 19; and a wireless interface for allowing the processor to communicate with another device.

Example 21 is a method which comprises: forming a first paramagnet; fabricating a stack of layers such that a portion of the stack of layers is adjacent to the first paramagnet, wherein the stack of layers is to provide an inverse spin-orbit coupling effect; forming a second paramagnet; forming a magnetoelectric layer adjacent to the second paramagnet; and coupling a conductor to at least a portion of the stack of layers and the magnetoelectric layer.

Example 22 includes the method of example 21, wherein the first and second paramagnets comprise a material which includes one or more of: Platinum, Palladium, Tungsten, Cesium, Aluminum, Lithium, Magnesium, or Sodium.

Example 23 includes features of the method of example 21, wherein the first and second paramagnets comprises dopants which include one or more of: Cr, Mn, Nb, Mo, Tc, Re, Nd, Gd, Tb, Dy, Ho, Er, Tm, or Yb.

Example 24 includes features of the method of example 21, wherein the stack of layers comprises: forming a first layer comprising Ag, wherein the first layer is adjacent to the first paramagnet; and forming a second layer comprising Bi, wherein the second layer is adjacent to the first layer and to the conductor.

Example 25 includes features of the method of example 21, wherein the stack of layers comprises: forming a first layer comprising Ag, wherein the first layer is adjacent to the first paramagnet; and forming a second layer comprising W, wherein the second layer is adjacent to the first layer and to the conductor.

Example 26 includes features of the method of example 21, wherein the conductor comprises of a material which includes one or more of: Cu, Ag, Al, or Au.

Example 27 includes features of the method of example 21, wherein the magnetoelectric layer comprises a material which includes one of: Cr, O, $Cr_2O_3$ or multiferroic material.

Example 28 includes features of the method of example 21, wherein the multiferroic material comprises $BiFeO_3$.

Example 29 includes features of the method of example 21, wherein the stack of layers comprises a material which includes one or more of: $\beta$-Ta, $\beta$-W, W, Pt, Cu doped with Iridium, Cu doped with Bismuth, or Cu doped an element of 3d, 4d, 5d, 4f, or 5f of periodic table groups.

Example 30 includes features of the method of example 21, wherein the method of example 30 also comprises fabricating a transistor and coupling to the first paramagnet.

Example 31 includes features of the method of example 21, wherein the method of example 31 also comprises: forming a coupling a portion of the stack of the layers to ground; forming a coupling the first paramagnet to a negative supply; and forming a coupling the second paramagnet to ground.

Example 32 includes features of the method of example 21, wherein the method example 32 also comprises: forming a coupling the portion of the stack of the layers, coupled to the conductor, to ground; forming a coupling the first paramagnet to a positive supply; and forming a coupling the second paramagnet to ground.

Example 33 is a method which comprises: forming a first paramagnet having a first portion and a second portion; forming a first stack of layers, a portion of which is adjacent to the first portion of the first paramagnet, wherein the first stack of layers is to provide an inverse spin orbit coupling effect; forming a first magnetoelectric layer adjacent to the second portion of first paramagnet; forming a first conductor adjacent to the first magnetoelectric layer; forming a second conductor adjacent to at least a portion of the first stack of layers; forming a second paramagnet having a first portion and a second portion; forming a second stack of layers adjacent to the first portion of the second paramagnet, wherein the second stack of layers is to provide an inverse spin orbit coupling effect; forming a second magnetoelectric layer adjacent to the second portion of the second paramagnet; forming a second conductor adjacent to the second magnetoelectric layer; forming a third conductor adjacent to at least a portion of the second stack of layers; forming a third paramagnet having a first portion and a second portion; forming a third stack of layers, a portion of which is adjacent to the first portion of the third paramagnet, wherein the third stack of layers is to provide an inverse spin-orbit coupling effect; forming a third magnetoelectric layer adjacent to the second portion of the third paramagnet; forming a third conductor adjacent to the third magnetoelectric layer; forming a fourth conductor adjacent to at least a portion of the third stack of layers; and forming a fifth conductor coupled to the second, third, and fourth conductors.

Example 34 includes the features of example 33, wherein example 34 comprises: forming a fourth paramagnet having a first portion and a second portion; forming a fourth stack of layers, a portion of which is adjacent to the first portion of the fourth paramagnet, wherein the fourth stack of layers is to provide an inverse spin-orbit coupling effect; forming a sixth conductor adjacent to at least a portion of the fourth stack of layers; and forming a fourth magnetoelectric layer adjacent to the second portion of the fourth paramagnet, wherein the fourth magnetoelectric layer is adjacent to the fifth conductor.

Example 35 includes the features of example 34, wherein the first, second, third, and fourth paramagnets comprise a material which includes one or more of: Platinum, Palladium, Tungsten, Cesium, Aluminum, Lithium, Magnesium, or Sodium.

Example 36 includes features of example 34, wherein the first, second, third, and fourth paramagnets comprises dopants which comprises one or more of: Cr, Mn, Nb, Mo, Tc, Re, Nd, Gd, Tb, Dy, Ho, Er, Tm, or Yb.

Example 37 includes the features of example 34, wherein the first, second, third, and fourth magnetoelectric layers are formed of a material which comprises one or more of: $Cr_2O_3$ or multiferroic material.

Example 38 includes the features of example 37, wherein the multiferroic material comprises $BiFeO_3$.

Example 39 includes the features of example 34, wherein the first, second, third, and fourth stack of layers comprises a material which includes one or more of: β-Ta, β-W, Pt, Cu doped with Iridium, Cu doped with Bismuth, or Cu doped an element of 3d, 4d, 5d, 4f, or 5f of periodic table groups.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first paramagnet;
a stack of layers, a portion of which is adjacent to the first paramagnet, wherein the stack of layers is to provide an inverse spin-orbit coupling effect;
a second paramagnet;
a layer adjacent to the second paramagnet, wherein the layer comprises magnetoelectric material; and
a conductor coupled to at least a portion of the stack of layers and the layer.

2. The apparatus of claim 1, wherein the first and second paramagnets comprises a material which includes one or more of: Pt, Pd, W, Ce, Al, Li, Mg, Na, Cr, Co, Dy, Er, Eu, Gd, Fe, Nd, K, Pr, Sm, Tb, Tm, or V.

3. The apparatus of claim 2, wherein the stack of layers comprises:
a first layer comprising Ag, wherein the first layer is adjacent to the first paramagnet; and
a second layer comprising Bi, wherein the second layer is adjacent to the first layer and to the conductor.

4. The apparatus of claim 2, wherein the stack of layers comprises:
a first layer comprising Ag, wherein the first layer is adjacent to the first paramagnet; and
a second layer comprising W, wherein the second layer is adjacent to the first layer and to the conductor.

5. The apparatus of claim 1, wherein the conductor comprises a material which includes one or more of: Cu, Ag, Al, or Au.

6. The apparatus of claim 1, wherein the magnetoelectric material includes one of: Cr or multiferroic material.

7. The apparatus of claim 6, wherein the multiferroic material comprises: Bi and Fe.

8. The apparatus of claim 1, wherein the stack of layers comprises a material which comprises one or more of: β-Ta, β-W, W, Pt, Cu doped with Iridium, Cu doped with Bismuth, or Cu doped an element of 3d, 4d, 5d, 4f, or 5f of periodic table groups.

9. The apparatus of claim 1 comprises a transistor coupled to the first paramagnet.

10. The apparatus of claim 1, wherein a portion of the stack of the layers is coupled to ground, wherein the first paramagnet is coupled to a negative supply, and wherein the second paramagnet is coupled to ground.

11. The apparatus of claim 1, wherein a portion of the stack of the layers is coupled to ground, wherein the first paramagnet is coupled to a positive supply, and wherein the second paramagnet is coupled to ground.

12. The apparatus of claim 1, wherein the first and second paramagnets have in-plane magnetic anisotropy.

13. An apparatus comprising:
a first paramagnet having a first portion and a second portion;
a first stack of layers, a portion of which is adjacent to the first portion of the first paramagnet, wherein the first stack of layers is to provide an inverse spin orbit effect;
a first layer adjacent to the second portion of first paramagnet, wherein the first layer comprises magnetoelectric material;
a first conductor adjacent to the first layer;
a second conductor adjacent to at least a portion of the first stack of layers
a second paramagnet having a first portion and a second portion;
a second stack of layers adjacent to the first portion of the second paramagnet, wherein the second stack of layers is to provide an inverse spin orbit effect;
a second layer adjacent to the second portion of the second paramagnet, wherein the second layer comprises magnetoelectric material;
a third conductor is adjacent to the second layer;
a fourth conductor adjacent to at least a portion of the second stack of layers;
a third paramagnet having a first portion and a second portion;
a third stack of layers, a portion of which is adjacent to the first portion of the third paramagnet, wherein the third stack of layers is to provide an inverse spin-orbit coupling effect;
a third layer adjacent to the second portion of the third paramagnet, wherein the third layer comprises magnetoelectric material;
a fifth conductor adjacent to the third layer;
a sixth conductor adjacent to at least a portion of the third stack of layers; and
a seventh conductor coupled to the second, fourth and sixth conductors.

14. The apparatus of claim 13 comprises:
a fourth paramagnet having a first portion and a second portion;
a fourth stack of layers, a portion of which is adjacent to the first portion of the fourth paramagnet, wherein the fourth stack of layers is to provide an inverse spin-orbit coupling effect;
an eighth conductor adjacent to at least a portion of the fourth stack of layers; and
a fourth layer adjacent to the second portion of the fourth paramagnet, wherein the fourth layer comprises magnetoelectric material, and wherein the fourth layer is adjacent to the seventh conductor.

15. The apparatus of claim 14, wherein the first, second, third, and fourth paramagnets comprise a material which includes one or more of: Platinum, Palladium, Tungsten, Cesium, Aluminum, Lithium, Magnesium, or Sodium.

16. The apparatus of claim 14, wherein the first, second, third, and fourth paramagnets comprises dopants which comprises one or more of: Cr, Mn, Nb, Mo, Tc, Re, Nd, Gd, Tb, Dy, Ho, Er, Tm, or Yb.

17. The apparatus of claim 14, wherein the magnetoelectric material includes one or more of: Cr or multiferroic material, and wherein the multiferroic material comprises Bi and Fe.

18. The apparatus of claim 14, wherein the first, second, third, and fourth stack of layers comprises a material which includes one or more of: β-Ta, β-W, W, Pt, Cu doped with Iridium, Cu doped with Bismuth, or Cu doped an element of 3d, 4d, 5d, 4f, or 5f of periodic table groups.

19. A system comprising: a memory; a processor coupled to the memory, the processor including an apparatus which comprises:

a first paramagnet;

a stack of layers, a portion of which is adjacent to the first paramagnet, wherein the stack of layers is to provide an inverse spin-orbit coupling effect;

a second paramagnet;

a layer adjacent to the second paramagnet, wherein the layer comprises magnetoelectric material; and a conductor coupled to at least a portion of the stack of layers and the layer; and a wireless interface to allow the processor to communicate with another device.

20. The apparatus of claim 19, wherein the first and second paramagnets comprises a material which includes one or more of: Pt, Pd, W, Ce, Al, Li, Mg, Na, Cr, Co, Dy, Er, Eu, Gd, Fe, Nd, K, Pr, Sm, Tb, Tm, or V.

21. The apparatus of claim 1 comprising:

a first transistor coupled to a first portion of the first paramagnet, wherein the first portion is adjacent to a magnetoelectric material, wherein the first transistor is of a first conductivity type; and a second transistor coupled to the first portion of the first paramagnet, wherein the second transistor is of a second conductivity type.

22. The apparatus of claim 21, wherein the first transistor is coupled to a power supply node, wherein the second transistor is coupled to a ground.

23. The apparatus of claim 21, wherein the first and the second transistors are controllable by a same control.

\* \* \* \* \*